United States Patent [19]
Shirai

[11] Patent Number: 6,128,423
[45] Date of Patent: Oct. 3, 2000

[54] REFLECTION TYPE MAGNETO-OPTIC SENSOR

[75] Inventor: Kazushi Shirai, Tokyo, Japan

[73] Assignee: Mitsubishi Gas Chemical Company, Inc, Tokyo, Japan

[21] Appl. No.: 09/122,637

[22] Filed: Jul. 27, 1998

[30] Foreign Application Priority Data

Jul. 29, 1997 [JP] Japan .................................. 9-203117

[51] Int. Cl.$^7$ .............................. G02B 6/00; G02B 27/28
[52] U.S. Cl. .......................... 385/12; 359/483; 359/484; 250/227.11; 250/227.17
[58] Field of Search ....................... 385/11, 12; 372/703; 250/225, 227.11, 277.17; 359/280, 282, 484, 483

[56] References Cited

U.S. PATENT DOCUMENTS

| | | | |
|---|---|---|---|
| 5,463,316 | 10/1995 | Shirai et al. ............................. | 359/484 |
| 5,493,222 | 2/1996 | Shirai et al. ............................. | 359/280 |
| 5,557,692 | 9/1996 | Pan et al. .................................. | 385/11 |
| 5,559,633 | 9/1996 | Emkey ..................................... | 359/484 |
| 5,939,711 | 8/1999 | Crawford et al. .................. | 250/277.17 |

FOREIGN PATENT DOCUMENTS

| | | |
|---|---|---|
| 0104271 | 6/1985 | Japan ...................................... 385/12 |
| 6-263597 | 9/1994 | Japan . |
| 10-31057 | 2/1998 | Japan . |

OTHER PUBLICATIONS

"Fiber Optic Tachometer Based on the Faraday Effect" by Zook et al, vol. 28, Applied Optics, Jun. 1989, pp. 1991–1994.

"Faraday Rotation and Optical Absorption of a Single Crystal of Bismuth–Substituted Gadolinium Iron Garnet" by Takeuchi et al, J. Appl. Phys., vol. 44, No. 10, Oct. 1973, pp. 4789–4790.

*Primary Examiner*—Cassandra Spyrou
*Assistant Examiner*—John Juba, Jr.
*Attorney, Agent, or Firm*—Sughrue, Mion, Zinn, Macpeak & Seas, PLLC

[57] ABSTRACT

A reflection type magneto-optic sensor includes a light path assembly, a lens, a polarizer, a bismuth-substituted rare earth iron garnet single crystal film (BIG film), a non-magnetic garnet substrate, and a mirror, all being aligned in this order along the optical axis of the lens. The light path assembly has a light-inputting path and a light-outputting path parallel to each other. The lens has a focal point, the optical axis parallel to the light-inputting path and the light-outputting path, and first and second surfaces normal to the optical axis. The light-inputting path and the light outputting path are disposed in proximity to the focal point of the lens so that light exiting the light inputting path enters the lens and is then reflected back by the mirror into the light-outputting path. The BIG film is grown on the non-magnetic garnet substrate by a liquid epitaxial method and the polarizer is bonded on the BIG film, so that the BIG film is held between the polarizer and the non-magnetic garnet substrate in a sandwiched relation. The polarizer and the non-magnetic garnet substrate lapped to taper in opposite directions at an angle in the range from 3 to 20° so that the BIG film is at an angle with the optical axis of the lens when the substrate-BIG-polarizer assembly is placed with the lapped surfaces normal to the optical axis of the lens.

9 Claims, 3 Drawing Sheets

REFLECTION TYPE MAGNETO-OPTIC SENSOR

BACKGROUND OF THE INVENTION

1. Field of the Invention

The present invention relates to a magneto-optic sensor head using the Faraday effect of a bismuth-substituted rare earth iron garnet film.

2. Description of Related Art

A magneto-optic sensor head formed of a bismuth-substituted rare earth iron garnet film is small in size and can be advantageously used in tachometers. Many of industrial apparatuses and consumer products incorporate rotating devices and rotating mechanisms such as motors and gears. Technological advancement have placed strong demands on energy saving and the conservation of global environment and therefore there have been strong needs in the fields of vehicles such as aircraft, ships, and automobiles towards highly accurate, and precise control. In order to control rotating mechanisms and apparatuses with high accuracy and precision, the rotational speeds must be monitored continuously and measured accurately.

Accordingly, a need exists in the art for simple measuring devices which can accurately measure rotational speeds, and such devices should be supplied in large quantity on a commercial base. Various methods of measuring rotational speeds have been proposed, including a method using magnetic induction (SENSOR TECHNOLOGY, December, 1986, p68) and a method using a magneto-optic sensor using the Faraday effect of a magneto-optic material (Applied Optics, Vol. 28, No. 11, 1989, P1992).

The method based on electromagnetic induction is used in measuring the rotational speeds of the engines for aircraft and automobiles. However, this kind of tachometers suffer from a serious drawback that the transmission lines (cables), which run between the sensor and rotating mechanism, are apt to pick up electromagnetic noise.

The probe for detecting a magnetic field is an electrical circuit. The electrical circuit must be of explosion proof construction if the measurement is to be made at a place where dangerous materials such as organic solvents and inflammable materials are manufactured or handled.

In contrast, a magneto-optic sensor formed of a material having the Faraday effect transmits an optical signal and is almost completely free from electromagnetic noise. Thus, the sensor does not have to be of explosion proof construction even if the sensor is used at a premise where organic solvents and inflammable materials are handled.

When light is transmitted through a magneto-optic material placed in a magnetic field, the polarization plane of the light is rotated due to the magnetic field. The sensor converts changes in the rotation of polarization plane into changes in intensity (National Technical Report, Vol. 29, No. 5, p70 (1983)).

One practical configuration of a magneto-optic sensor is a transmission type which includes an optical path, a lens, a polarizer, a magneto-optic element, an analyzer, another lens, and another optical path, aligned straight in this order. Another configuration is a reflection type including an optical path, a lens, a polarizer (analyzer), a magneto-optic element, and a mirror (prism), aligned straight in this order. The reflection type lends itself to a miniaturized magneto-optic sensor. The inventors of the present invention have proposed a reflection type magneto-optic sensor that uses a bismuth-substituted rare earth iron garnet with a large Faraday effect as a magneto-optic element (Japanese Patent Application No. 8-184868).

This reflection type magneto-optic sensor incorporates a single optical fiber for inputting and outputting light, a lens, a polarizer, and a bismuth-substituted rare earth iron garnet single crystal film (referred to as BIG) with the film surface placed at an angle with the optical path, and a mirror, all being aligned in this order. When the BIG is positioned with the film surface inclined relative to the optical path, there are a larger number of magnetic domains in an area of the film through which the light passes. The Faraday rotations due to individual magnetic domains cancel out each other when no external magnetic field is applied to the film or the film is not magnetically saturated.

The BIG has the following properties.

(1) When the BIG is not magnetically saturated, it is of a multi-domain structure. The individual magnetic domains are perpendicular to the film surface and adjacent magnetic domains are opposite in polarity.

(2) Faraday rotation angles $\theta_F$ of individual magnetic domains are the same as when the BIG is magnetically saturated, and are opposite in polarity for adjacent domains.

(3) When placed in an external magnetic field, the magnetic domains of the same direction as the external magnetic field become larger in size, and the magnetic domains of the opposite direction become smaller.

(4) When the external magnetic field becomes stronger than a predetermined value, all the magnetic domains are oriented in the same direction.

Light emitting diodes that emit light having wavelengths of 830 nm and 850 nm are inexpensive and readily available. However, it was revealed that when such a light source is used, the reflection type magneto-optic sensor decreases the optical signal strength to a level insufficient for use as a magneto-optic sensor. The inventors conducted research in order to determine what factors cause decreases in signal strength. The inventors found that in order for a sensor to provide a sufficient signal strength despite a large amount (10–14 dB) of absorption of light by the BIG, some special measure must be taken for suppressing the reflection at the connection where the optical fiber is connected to other optical elements. Such special measures are, for example, machining the end surface of the optical fiber in a special manner or application of an anti-reflection film to the end surface of the optical fiber.

FIG. 6 illustrates the light absorption characteristic of a bismuth-substituted rare earth iron garnet single crystal in the near infrared region, and the Faraday effect versus wavelengths (Journal of Applied Physics Vol. 44, p4789 (1973)).

Referring to FIG. 6, the Faraday effect of a BIG (Faraday rotation coefficient, $\theta_F$) is large in short wavelength regions and small in long wavelength regions. FIG. 6 shows that the addition of Bi greatly increases the Faraday effect compared to a rare earth iron garnet single crystal film without Bi.

The optical absorption coefficient is primarily determined by iron ions and not affected by the amount of Bi. The optical absorption coefficient is large in the short wavelength regions and small in the long wavelength regions. Some increase in the optical absorption coefficient is observed at wavelengths around 900 nm. Light having wavelengths longer than 5000 nm is not transmitted through the BIG due to light absorption resulting from lattice vibration.

SUMMARY OF THE INVENTION

An object of the present invention is to provide a reflection type magneto-optic sensor which is free from noise resulting from reflected light.

A reflection type magneto-optic sensor comprises a light path assembly, a lens, a polarizer, a bismuth-substituted rare earth iron garnet single crystal film (BIG film), a non-magnetic garnet substrate, and a mirror, all being aligned in this order along the optical axis. The lens has a focal point, an optical axis, and first and second surfaces normal to the optical axis.

The light path assembly has a light-inputting path and a light-outputting path parallel to the optical axis which paths are disposed in proximity to the focal point of the lens, so that light exiting the light inputting path enters the lens and is then reflected back by the mirror into the light-outputting path.

The BIG film is grown on the non-magnetic garnet substrate by the liquid epitaxial method (LPE) and the polarizer is bonded on the BIG film, so that the BIG film is sandwiched between the polarizer and the non-magnetic garnet substrate. The polarizer and the non-magnetic garnet substrate are lapped to taper in opposite directions at an angle in the range from 3 to 20°, so that the BIG is at an angle when the sandwiched construction is positioned with the lapped surfaces at an angle with the optical axis of the lens.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

A magneto-optic sensor head according to the present invention is a reflection type magneto-optic sensor head which includes: a light path assembly having a light inputting path and a light outputting path which are closely disposed parallel to each other; a lens; a polarizer; a bismuth-substituted rare earth iron garnet single crystal film (BIG); a non-magnetic garnet substrate on which the bismuth-substituted rare earth iron garnet single crystal film is grown by a liquid phase epitaxial method; and a mirror.

The light path assembly, lens, polarizer, BIG film, non-magnetic substrate, and mirror are aligned in this order. The light inputting path and light outputting path are disposed in proximity to the lens such that the light exiting the light inputting path is transmitted through the lens, reflected by the mirror back to the lens, transmitted through the lens, and coupled to the light outputting path. The polarizer and the non-magnetic garnet substrate are in the shape of a tapered plate. The tapered plate has surfaces at an angle in the range of 3 to 20° with each other. The polarizer and the non-magnetic garnet substrate have surfaces remote from the bismuth-substituted rare earth iron garnet single crystal film, the surfaces being parallel to each other and normal to the optical axis X of the lens.

The lens is a spherical lens fixed in a sheath or a graded refractive index lens. The lens has a focal point preferably at an end surface thereof or at an end of the sheath. The numerical aperture of the optical fiber on the light outputting side is the same as or greater than that on the light inputting side. The light inputting and outputting paths, lens, polarizer, BIG, and non-magnetic garnet substrate, and mirror are bonded to each other for integral construction.

Figure 1A:
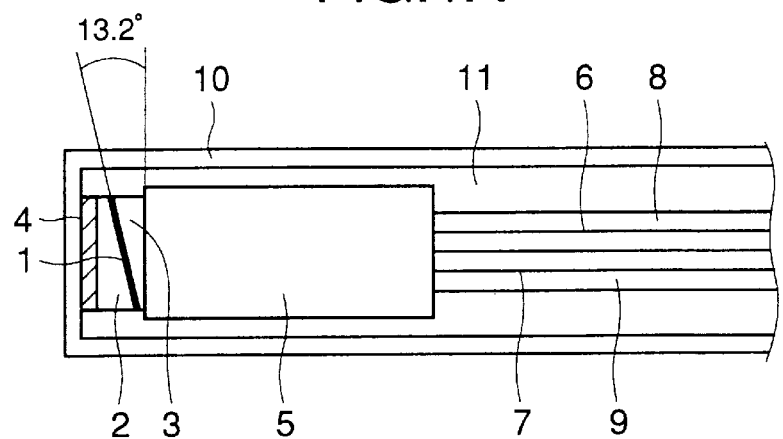
FIG. 1A illustrates a reflection type magneto-optic sensor head manufactured as a first example.
Figure 1B:
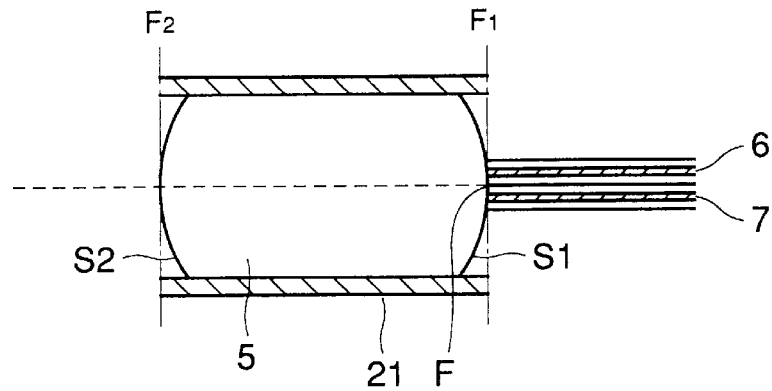
FIG. 1B illustrates a spherical lens fixed in a sheath 21.
Figure 2:
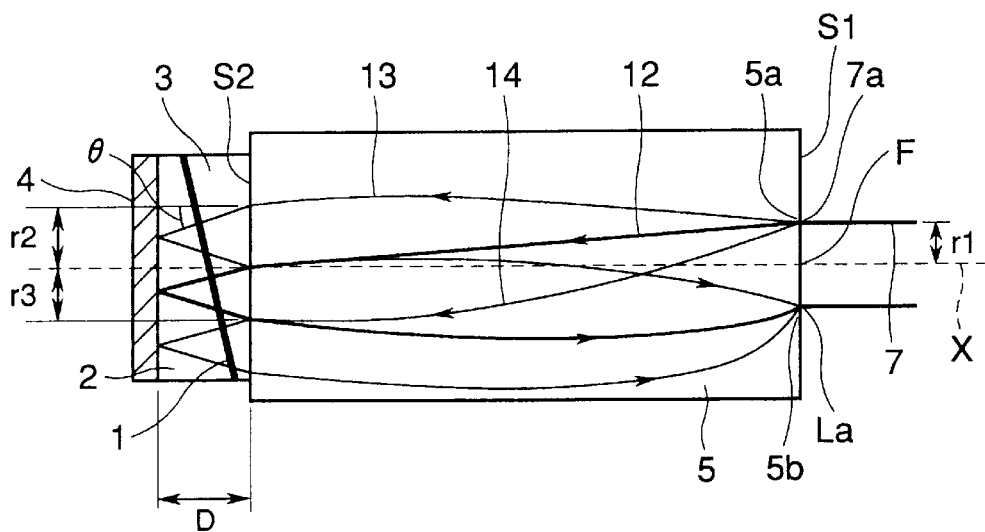
FIG. 2 illustrates how light is transmitted through the construction shown in FIG. 1A.

The invention will be described with reference to FIGS. 1A–1B and 2. FIG. 1A illustrates a reflection type magneto-optic sensor according to the invention. FIG. 2 illustrates how light is transmitted through the construction shown in FIG. 1A.

Figure 3:
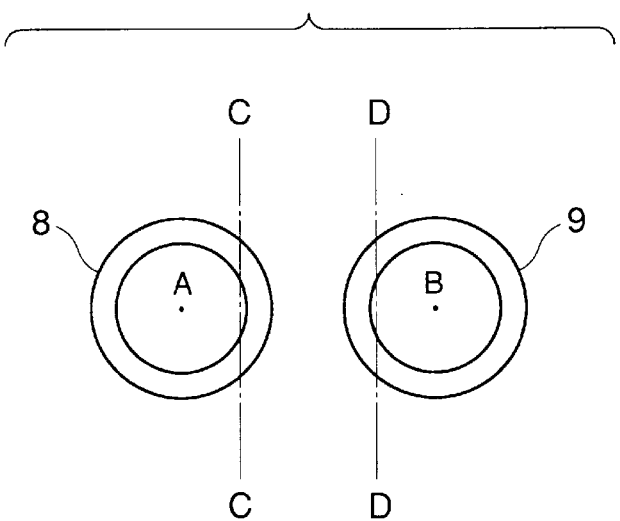
FIG. 3 shows two microcapillaries which are cut or removed away by a plane parallel to their longitudinal axes.
Figure 4:
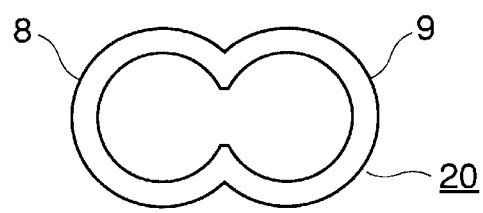
FIG. 4 shows microcapillaries bonded together at the cut parts shown in FIG. 3.
Figure 5:
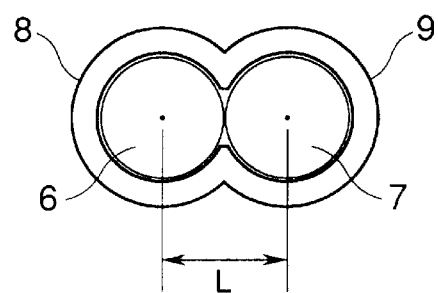
FIG. 5 shows the capillaries when optical fibers and are inserted thereinto.
Figure 6:
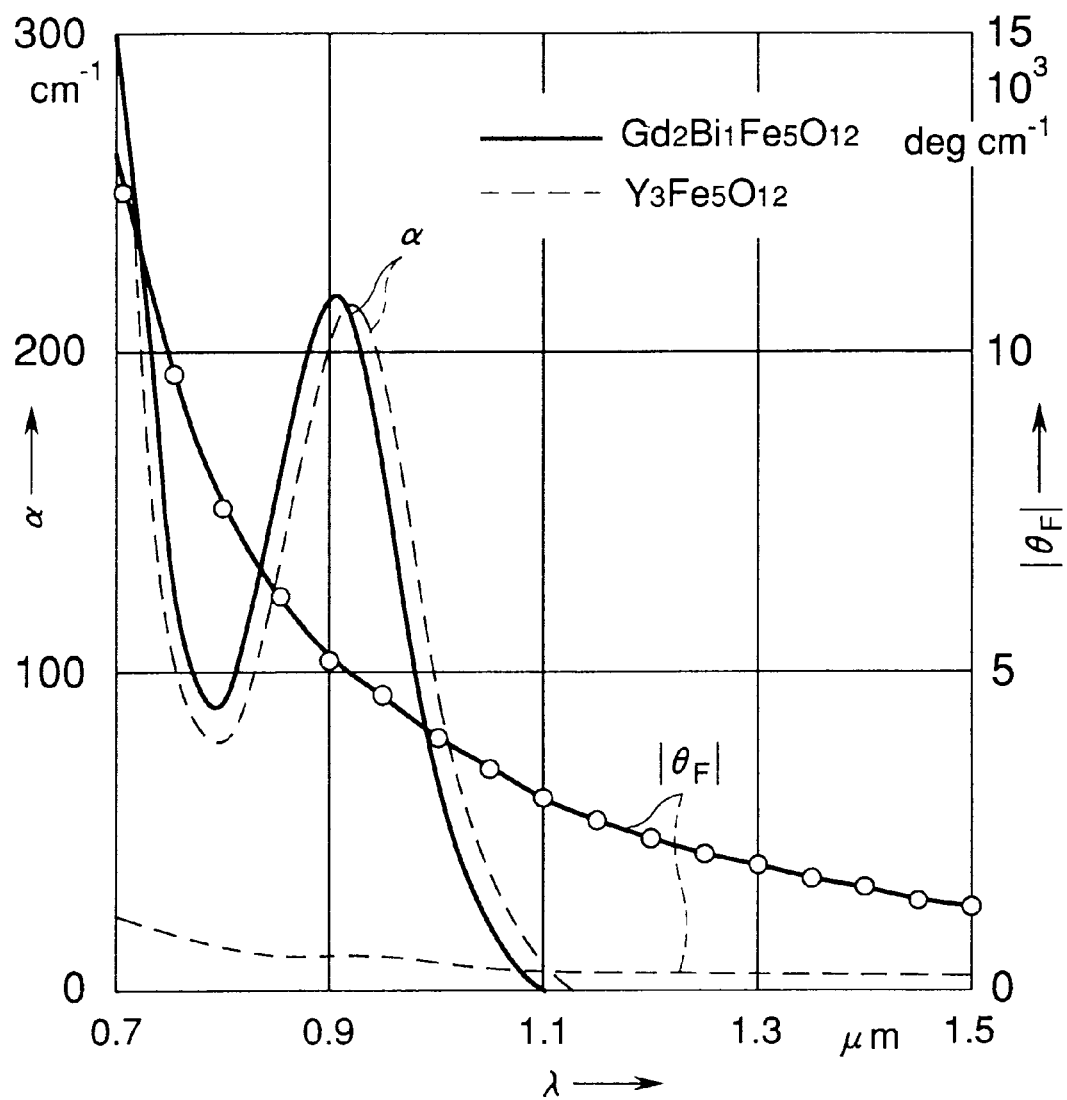
FIG. 6 illustrates the light absorption characteristic of a bismuth-substituted iron garnet in the near infrared region, and the Faraday effect versus wavelengths.

Referring to FIG. 1A, parts of two microcapillaries are cut or removed away by a plane parallel to their longitudinal axes as shown in FIG. 3, by for example, etching. The microcapillaries 8 and 9 extend in a direction perpendicular to the page of FIG. 3 and are cut away by planes C-C and D-D, respectively, which extend in the direction parallel to the axis passing through center A and B, respectively. The microcapillaries 8 and 9 are then bonded together at the cut parts as shown in FIG. 4 into a capillary assembly 20. When optical fibers 6 and 7 are inserted into the microcapillaries, the center-to-center distance L of optical fibers 6 and 7 is minimum as shown in FIG. 5. The optical fibers 6 and 7 can be as close to each other as their clads can touch each other.

A case 10 made of stainless steel accommodates the capillary assembly 20 with the optical fibers 6 and 7 inserted thereinto, a 0.25 pitch cylindrical graded refractive index lens 5, a polarizer 3 polished into a tapered shape, and a BIG 1 having a tapered non-magnetic substrate 2 with a mirror 4 formed thereon. Then, a resin is introduced into the case 10 so as to seal and hold these elements tightly together. Alternatively, the lens 5 may be a spherical lens fixed in a sheath 21 as shown in FIG. 1B. The lens 5 is a shape of a cylinder with spherical surfaces S1 and S2 at both opposing ends and focal planes F1 and F2 tangent to the spherical surfaces and perpendicular to the optical axis of the lens 5.

FIG. 2 is a model representation of the paths of a center ray 12 and side rays 13. As shown in FIG. 2, the capillary assembly 20 is positioned relative to the lens 5 such that the optical fibers 7 and 6 are parallel to the optical axis X of the lens 5 and the optical fiber 7 is on the opposite side of optical fiber 6 of a focal point F of the lens 5. The optical fiber 7 is shown above the focal point F and the optical fiber 6 is below the focal point F. The optical fiber 7 has a light-exiting end 7a and the optical fiber 6 has a light-entering end 6a, the light-exiting end 7a and light-entering end 6a lying in the same plane as a surface S1 of the lens 5.

The center ray 12 and side rays 13 and 14 leaving the optical fiber 7 are incident on the lens 5 and exit the lens 5 as substantially parallel rays in directions slightly downward from the surface S2 of the lens 5. The rays 12 and 13 are then reflected back by the mirror 4. The rays 12 and 13 travel slightly downward after they are reflected, and then enter the lens 5. The rays transmitted through the lens 5 are then coupled to the optical fiber 6 on the light outputting side.

The path through which light entering an optical path disposed parallel to and in proximity to a graded refraction index lens is given as follows:

$$r2 = 1/(n_0 A^{0.5}) \times \theta$$

$$\theta = -(n_0 A^{0.5}) \times r1$$

where r1 is a distance between the light inputting path and the axis X of the lens 5, θ1 is an incidence angle, r2 is a distance between the light exiting the other end of the lens 5 and the axis X of the lens, θ2 is an exit angle.

The above equation implies that the light reflected by the surface S2 of the lens 5, remote from the light incident side, is focused on a point 5b opposite to the light incident point 5a with respect to the focal point F of the lens 5. The light return reflected back by the mirror 4 is also focused on the point 5b. Thus, the light-entering end 6a of the optical fiber (light-outputting path) 6 is located at this focal point 6a to receive the output light. It is to be noted that when the light enters from the optical fiber 7 into the lens 5, some of the light incident on the lens 5 is reflected by the surface S1 of the lens 5. The light reflected by the surface S1 does not enter the focal point 5b. The intensity of the light reflected back by the surface S2 toward the surface S1 is much less than the light reflected back by the surface S1 into the optical fiber 7.

As a result, a very small amount of light resulting from unwanted reflection is coupled to the optical fibers 6 on the light outputting side. Therefore, even if the BIG is used with light in the regions of 830 nm and 850 nm at which optical absorption of the BIG is relatively large, the unwanted reflected light which is a source of noise is not significant. This ensures detection of the signal.

The light-inputting and outputting paths of the invention can take the form of an optical wave guide patterned in materials such as optical fiber, glass, and polymeric film. In use, the optical wave guide is usually coupled to an optical fiber. Therefore, the light-inputting and outputting paths is preferably in the form of an optical fiber.

The distance between the light-inputting path and the light-outputting path should be such that the aforementioned conditions with respect to the focal points are accomplished. As the distance r1 of the light-inputting path and the axis X of the lens 5 increases, the rays exiting the lens 5 from the surface S2 make larger angles with the axis X and more components of the light reflected by the mirror 4 arriving at the surface S1 make large angles with the axis X. Further, as the distance D between the lens 5 and the mirror 4 becomes longer, the center ray 12 of the light reflected back by the mirror 4 enters the lens 5 at a longer distance r3 from the axis X, and more components of the reflected light arriving at the surface S1 make large angles with the axis X.

Optical coupling efficiency can be increased by decreasing the offset of the light inputting path from the axis X of the lens. For this purpose, the light inputting path 7 is preferably small both in diameter and in numerical aperture. Thus, if an optical fiber is used, the optical fiber should be a small-diameter graded index fiber whose core diameter is in the range of 10–100 μm and overall diameter is 50 to 200μ including the clad. The light outputting path 6 should have as large a numerical aperture as possible. The numerical aperture of the light-outputting path 6 is preferably the same as or larger than that of the light-inputting path 7, so that the light outputting path 6 can easily be assembled.

The light-inputting path and light-outputting path may be advantageously assembled by inserting the optical fibers into two glass capillaries connected and fixed together with a predetermined inner wall-to-inner wall distance. The glass microcapillaries are preferably ground off at their side walls along the length as shown in FIG. 3 and then connected together at their ground parts as shown in FIG. 4, so that the walls of the glass capillaries do not make the light-inputting path and light outputting path too far from each other.

The lens 5 can take the form of a graded refractive index lens, spherical lens, or aspherical lens. A spherical lens fixed in a sheath and a graded refractive index lens are desirable, and particularly a graded refractive index lens, and still particularly a lens having a focal point on its end surface.

The polarizer used in the present invention may be in the form of a double refraction polarizer made of rutile or calcite, or a dichroic glass polarizer (commercially available under the trade name of POLARCORE manufactured by CORNING).

The bismuth-substituted rare earth iron garnet single crystal film (BIG) grown on a substrate is expressed by a general chemical formula;

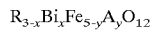

$$R_{3-x}Bi_xFe_{5-y}A_yO_{12}$$

where R is at least one element selected from the group consisting of Y, La, Ce, Pr, Nd, Sm, Eu, Gd, Tb, Dy, Ho, Er, Tm, Yb and Lu, A is at least one element selected from the group of Ga, Sc, Al, and In, and x has the range of $0.3 \leq x < 2.0$ and y has the range of $0 \leq y \leq 1.0$.

The BIG according to the present invention can be manufactured by usual methods, preferably by a liquid phase epitaxial method (LPE) where the bismuth-substituted rare earth iron garnet single crystal is formed on a substrate. This substrate may be selected from substrates commercially available as SGGG substrates, i.e., non-magnetic garnet $[(GdCa)_3(GaMgZr)_5O_{12}]$ having a lattice constant in the range of 1.2490 to 1.2515 nm.

The mirror 4 may be selected according to the design purpose from the following types:

(1) A metal thin film mirror where metal is vapor-deposited on a glass plate.

(2) A mirror case finished to have a mirror-like bottom.

(3) A metal thin film mirror where gold or aluminum is vapor-deposited on the surface of a BIG grown on a substrate.

(4) A dielectric multi-layer film mirror formed of a multi-layer of metal oxides such as $SiO_2$ and $TiO_2$.

In order to achieve a miniaturized inexpensive sensor, the present invention uses the metal thin film mirror where metal is vapor-deposited directly on the surface of a substrate.

As described in in the description of the related art, when the BIG is positioned with the film surface inclined relative to the optical path, there are a larger number of magnetic domains in an area of the film through which the light passes. Thus, the film surface of the BIG of the present invention is inclined with respect to the path of the light incident thereupon. The changes in light intensity can be detected when the BIG is inclined at angles greater than 3° and clearly detected at angles greater than 5°. The larger the inclination angle of the BIG, the higher the signal-to-noise ratio of the magneto-optic sensor. In principle, the BIG can be inclined further as far as the total reflection angle is less than 47°. However, the distance between the lens 5 and the mirror 4 increases with increasing inclination angle of the BIG. This is not desirable. Thus, the inclination angle of the BIG should be in the range of 3 to 20°, and preferably in the range of 5 to 15°.

For the aforementioned reason, the polarizer 3 and the the substrate 2 on which the BIG 1 is grown are lapped to taper in opposite directions, respectively, such that the BIG film surface makes an angle in the range of 5 to 20° with the light path of the light incident upon the BIG 1. In reality, the polarizer is bonded to the surface of the BIG grown on a substrate and then the surface of the laminated assembly is lapped. In other words, the surfaces of the polarizer 3 and substrate 2 are lapped such that the polarizer 3 and substrate 2 are tapered in the opposite directions but the lapped surfaces are parallel to each other.

EXAMPLE 1

FIG. 1A illustrates a reflection type magneto-optic sensor head manufactured as a first example.

A polarizer 3 having a thickness of 500 μm was fixed by an epoxy adhesive on a BIG 1 which was grown on a substrate for a wavelength of 0.82 μm. The BIG 1 is 500 μm thick, and has a chemical formula $(HoTbBi)_3Fe_5O_{12}$, a saturation magnetization 1050 Oe, and a Faraday rotation angle of 45.4° at 0.82 μm.

Then, the substrate 2 on which the BIG 1 has been grown and the polarizer 3 were polished so that their surfaces are tapered at an angle of 13.2° with the surface of the BIG 2, and subsequently diced into pieces having a size of 2 mm×2 mm. Thereafter, aluminum was vapor-deposited on the polished surfaces to form a reflection film or mirror 4, thereby completing a Faraday rotator block.

A graded index optical fiber having a core diameter of 100 μm and an overall diameter of 140 μm was inserted into a microcapillaries 8 and 9 and fixed therein. This microcapillary assembly was attached to a graded refractive index lens 5 (commercially available under the trade name of "SELFOC MICROLENS" manufactured by NIPPON ITA GLASS), thereby building a lens block. The lens block was then mounted to the Faraday rotator block and the whole assembly is accommodated in a case 10 made of stainless steel. Then, a silicone sealing compound 11 was introduced into the case 10 to seal the entire assembly, thereby completing a magneto-optic sensor head.

This magneto-optic sensor head was placed in position in a magnetic field generator (commercially available under the trade name of "MAGNET" manufactured by MAGNETICS). Light having a wavelength of 820 nm emitted from a light emitting diode is coupled into the optical fiber 7 and the light output from the optical fiber 6 was directed to a photodetector in order to measure the intensity of the output light. The light intensity was measured at various magnetic field strengths.

When the magnetic field strength of 1050 Oe was applied to the Faraday rotator, the Faraday rotator reached its magnetic saturation and the light intensity transmitted through the Faraday rotator reached a constant value. The ratio of light intensity when the magnetic field strength was 1050 Oe to that when the magnetic field strength was zero was 13.3 dB.

EXAMPLE 2

A reflection type magneto-optic sensor head was manufactured in the same manner as Example 1 except that the angle of tapered shape of the polarizer 3 was 6°. The ratio of the light intensity was 12.4 dB.

EXAMPLE 3

Using the magneto-optic sensor of Example 1, light from a semiconductor laser of 810 nm was coupled to the optical fiber 7 so that the polarization plane of the light was in a direction in which the polarizer 3 of the magneto-optic sensor head is oriented. The ratio of light intensity was 25.8 dB, which is significantly large.

EXAMPLE 4

A reflection type magneto-optic sensor head was manufactured in the same manner as Example 1 except that a BIG $((YLaBi)_3(FeGa)_5O_{12})$ which was grown on a substrate and has a saturation magnetization of 250 Oe was used in place of the BIG 1 which was grown on a substrate 2 and has a saturation magnetization of 1050 nm. The ratio of light intensity when the magnetic field strength was 250 Oe to that when the magnetic field strength was zero was 12.8 dB. Thus, Example 4 is more sensitive to an external magnetic field than Examples 1–3.

Comparison 1

A reflection type magneto-optic sensor head was manufactured in the same manner as Example 1 except that the angle of tapered surfaces of the polarizer 3 was 1°. The ratio of intensity when the magnetic field strength was 1050 Oe to that when the magnetic field strength was zero was 0.9 dB.

Comparison 2

A reflection type magneto-optic sensor head was manufactured in the same manner as Example 1 except that the angle of tapered surfaces of the polarizer 3 was 3°. The ratio of intensity when the magnetic field strength was 1050 Oe to that when the magnetic field strength was zero was 4.3 dB.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A reflection type magneto-optic sensor comprising:

a light path assembly having a light-inputting path and a light-outputting path parallel to each other;

a lens having, a focal point, an optical axis parallel to the light-inputting path and the light-outputting path, and first and second surfaces normal to the optical axis;

a polarizer;

a bismuth-substituted rare earth iron garnet single crystal film; and a non-magnetic garnet substrate on which the bismuth-substituted rare earth iron garnet single crystal film is grown by a liquid epitaxial method; and a mirror;

wherein the light path assembly, lens, polarizer, bismuth-substituted rare earth iron garnet single crystal film, non-magnetic garnet substrate, and mirror are aligned in this order along the optical axis;

said light-inputting path and said light outputting path are disposed in proximity to the focal point so that light exiting said light inputting path enters said lens and is then reflected back by the mirror into said light-outputting path;

said polarizer and said non-magnetic garnet substrate are shaped to taper in parallel and opposite directions so that the bismuth-substituted rare earth iron garnet single crystal film is sandwiched between the polarizer and the non-magnetic garnet substrate and inclined at an angle in the range from 3 to 20° with a plane normal to the optical axis.

2. The reflection type magneto-optic sensor according to claim 1, wherein the polarizer has a third surface and the non-magnetic garnet substrate has a fourth surface, the third and fourth surfaces being normal to the optical axis and remote from the bismuth-substituted rare earth iron garnet single crystal film.

3. The reflection type magneto-optic sensor according to claim 2, wherein the light inputting path has a light-exiting end and the light outputting path has a light-entering end, said light-exiting end and light-entering end lying in a focal plane of said lens and being on opposite sides of the focal point of the lens.

4. The reflection type magneto-optic sensor according to claim 3, wherein the first surface lies in the focal plane.

5. The reflection type magneto-optic sensor according to claim 3, wherein the mirror is normal to the optical axis.

6. The reflection type magneto-optic sensor according to claim 1, wherein the lens is a graded refractive index lens and has the focal point on the first surface.

7. The reflection type magneto-optic sensor according to claim 1, wherein the light-inputting path and light outputting path are formed of an optical fiber, the light-inputting path having a numerical aperture the same as or larger than the light-outputting path.

8. The reflection type magneto-optic sensor according to claim 1, wherein the light-inputting/outputting paths, lens, polarizer, bismuth-substituted rare earth iron garnet single crystal film, non-magnetic garnet substrate, and mirror are bonded together in unitary construction.

9. The reflection type magneto-optic sensor according to claim 1, wherein the lens is a spherical lens fixed in a sheath and has the focal point on the first surface.

* * * * *